United States Patent
Florian et al.

(10) Patent No.: US 7,411,340 B2
(45) Date of Patent: Aug. 12, 2008

(54) PIEZOELECTRIC TRANSFORMER

(75) Inventors: Heinz Florian, Bad Gams (AT); Alexander Glazunov, Deutschlandsberg (AT); Igor Kartashev, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/705,810

(22) Filed: Feb. 12, 2007

(65) Prior Publication Data

US 2007/0194667 A1    Aug. 23, 2007

Related U.S. Application Data

(63) Continuation of application No. PCT/DE2005/001384, filed on Aug. 4, 2005.

(30) Foreign Application Priority Data

Aug. 13, 2004   (DE) .................. 10 2004 039 425

(51) Int. Cl.
    *H01L 41/107*   (2006.01)
(52) U.S. Cl. ...................... 310/359; 310/366
(58) Field of Classification Search .................. 310/359, 310/366
    See application file for complete search history.

(56) References Cited

U.S. PATENT DOCUMENTS

| | | | | |
|---|---|---|---|---|
| 2,830,274 A | | 4/1958 | Rosen et al. | |
| RE27,116 E | * | 4/1971 | Miller et al. | 310/359 |
| 4,564,782 A | * | 1/1986 | Ogawa | 310/359 |
| 5,828,160 A | * | 10/1998 | Sugishita | 310/366 |
| 6,366,006 B1 | * | 4/2002 | Boyd | 310/359 |
| 6,577,044 B1 | | 6/2003 | Li | |
| 7,019,993 B2 | * | 3/2006 | Vazquez Carazo | 363/67 |
| 2001/0028206 A1 | | 10/2001 | Watanabe et al. | |
| 2002/0074903 A1 | | 6/2002 | Phillips | |

FOREIGN PATENT DOCUMENTS

| | | | |
|---|---|---|---|
| DE | WO-2007-038914 A | * | 4/2007 |
| EP | 1 220 338 B1 | | 6/2006 |
| JP | 07-059338 | | 3/1995 |
| JP | 10-223939 A | * | 8/1998 |
| JP | 11-008420 | * | 1/1999 |
| JP | 11-8420 A | * | 1/1999 |
| JP | 11-145527 | * | 5/1999 |
| JP | 11-150310 | * | 6/1999 |
| JP | 2000-244033 A | | 9/2000 |
| JP | 2002-314160 | | 10/2002 |

\* cited by examiner

*Primary Examiner*—Thomas M Dougherty
(74) *Attorney, Agent, or Firm*—Slater & Matsil, L.L.P.

(57) ABSTRACT

A piezoelectric transformer with a base body is specified that has an input part and an output part, wherein at least three groups of internal electrodes are contained in at least one of these parts. The internal electrodes of each group are interconnected in an electrically conductive way. In this way, the internal electrodes of one group are electrically isolated from the internal electrodes of the other groups.

20 Claims, 3 Drawing Sheets

PIEZOELECTRIC TRANSFORMER

This application is a continuation of co-pending International Application No. PCT/DE2005/001384, filed Aug. 4, 2005, which designated the United States and was not published in English, and which is based on German Application No. 10 2004 039 425.3, filed Aug. 13, 2004, both of which applications are incorporated herein by reference.

TECHNICAL FIELD

A piezoelectric transformer is suitable for transforming a high voltage into a low voltage or vice versa.

BACKGROUND

Piezoelectric transformers are known, e.g., from U.S. Pat. No. 2,830,274.

A problem to be solved relates to specifying a piezoelectric transformer that on the one hand has good electrical characteristics and on the other hand has high dielectric strength.

SUMMARY OF THE INVENTION

A piezoelectric transformer comprises a base body that has an input part and an output part. At least three groups of internal electrodes are contained in at least one of these parts, wherein the internal electrodes of each group are interconnected in an electrically conductive way and are electrically isolated from the internal electrodes of the other groups.

The piezoelectric transformer preferably comprises at least two mechanically interconnected parts, an input part (primary side) and an output part (secondary side). Each part has layers of piezoelectric ceramic, wherein an internal electrode is arranged between two layers, one on top of the other. The internal electrodes of the same polarity are conductively interconnected by means of an external electrode (collector electrode) arranged on the surface of the base body.

An insulation layer can be arranged between the input part and output part of the transformer.

The piezoelectric ceramic in the layers of the input part and output part can be polarized by applying an electrical voltage to the external or internal electrodes of this base body part.

The input part or the output part can comprise at least two sections that have external electrodes, electrically isolated from each other, on the side surfaces of the body of the piezoelectric transformer. The ceramic layers of these sections have mutually opposite polarizations relative to the internal electrodes, which are connected to the common external electrode.

The adjacent sections of the same part (input part or output part) can have external electrodes that are conductively interconnected and are arranged on the surface of the base body. The interconnected external electrodes, which are assigned to various sections of the base body part and each form a part of a bus bar to which the first internal electrodes of these sections are connected, can be on opposite side surfaces of the base body. The first internal electrodes of adjacent sections can also be connected to a common external electrode or to the external electrodes that are arranged on the same side surface of the base body.

In one variant, two external electrodes of the adjacent sections of the same base body part (input or output part), with these electrodes being arranged on opposite side surfaces of the base body, are interconnected electrically by means of at least one internal electrode. In another variant, the electrical connections between the external electrodes of different sections of the same base body part can be created by means of conductive wires or by means of a conductor track running on the base body surface.

Advantages achieved with the specified piezoelectric transformer of an embodiment of the invention are two-fold. First, by adapting the thickness of the ceramic layers relative to the width of the insulation area, better polarization of the ceramic material can be achieved. Second, the width of the active area can be made large relative to the total width of the transformer. Both factors lead to better performance of the piezoelectric transformer.

BRIEF DESCRIPTION OF THE DRAWINGS

A piezoelectric transformer and an arrangement with a piezoelectric transformer are explained below with reference to schematic and not-to-scale figures. Shown schematically are.

DETAILED DESCRIPTION OF ILLUSTRATIVE EMBODIMENTS

Figure 1:
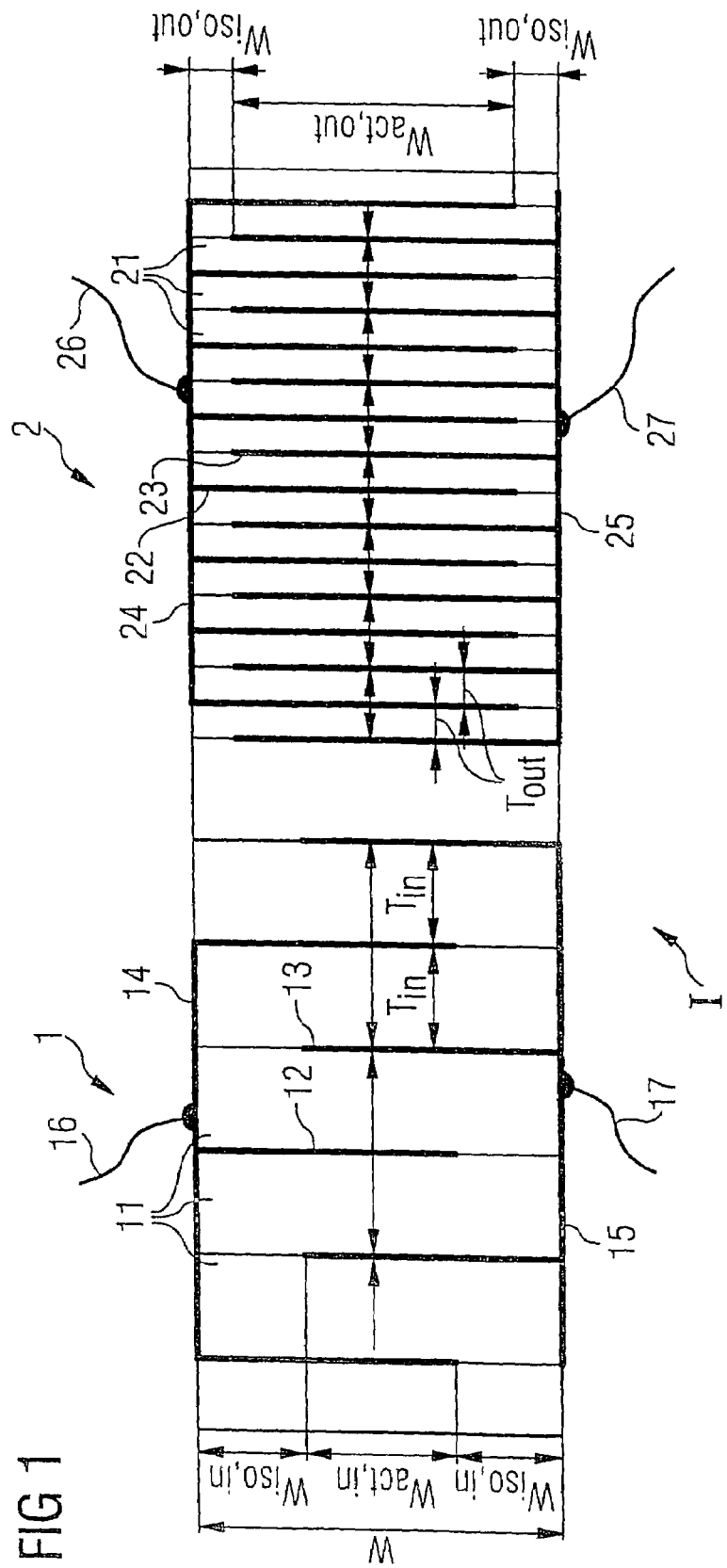
FIG. 1 is an example piezoelectric transformer.

FIG. 1 shows an example of a multilayer piezoelectric transformer. The transformer has an input part 1 and an output part 2. These parts are mechanically interconnected.

The input part 1 comprises several layers 11 that contain piezoelectric ceramic. Internal electrodes 12, 13, 22, and 23 are arranged between every two piezoelectric layers. The internal electrodes of different polarity arranged in the input part are designated by 12 and 13 and the internal electrodes of different polarity arranged in the output part are designated by 22 and 23. The first internal electrodes 12 are conductively interconnected by means of an external electrode 14 arranged on the surface of the transformer. The second internal electrodes 13 are interconnected by means of an external electrode 15. The first and second internal electrodes have an alternating arrangement.

The output part 2 of the transformer is constructed using similar means and methods. The first internal electrodes 22 and the second internal electrodes 23 are arranged between two piezoelectric layers 21. The internal electrodes 22 or 23 of the same polarity are conductively interconnected by external electrodes 24 or 25 arranged on the surface of the transformer. The external electrodes 14, 15 and 24, 25 can be connected to an external electric circuit by means of the connection wires 16, 17 and 26, 27.

The piezoelectric layers in the input part 1 and output part 2 are each polarized in a direction perpendicular to the internal electrodes 12, 13, 22, and 23. The ratio between the thicknesses of the ceramic layers 11 and 21 in the input part 1 and in the output part 2 determines the voltage and current transformation ratio of the transformer.

Although both the input part 1 and also the output part 2 have a multilayer structure in the transformer shown in FIG. 1, this is not absolutely necessary. The present invention can also be applied to piezoelectric transformers in which only one part—either the input part or the output part—has a multilayer structure.

Multilayer piezoelectric transformers as shown in FIG. 1 have, in a preferred embodiment, a restriction explained below in terms of the lateral extent of the transformer (in FIG. 1 this is the total width W of the base body) and in terms of the distance $T_{in}$ or $T_{out}$ between the internal electrodes. $T_{in}$ relates to the distance between the successive internal electrodes in the input part and $T_{out}$ relates to such a distance in the output part.

In order to polarize the piezoelectric layers 11 and 21 in the input part and output part of the transformer, an electrical voltage is applied between the internal electrodes of different polarity, 12 and 13 in the input part or 22 and 23 in the output part.

The characteristics of the ceramic and the electrical performance of the transformer depend greatly on the strength of the electric field that is generated within each ceramic layer when voltage is applied during the polarization. Such a characteristic is the electromechanical coupling factor of the ceramic. The greater this factor is, the better the performance of the transformer. Typically, one obtains high values for the coupling factor by polarizing the ceramic with an electric field on the order of magnitude of several kV/mm.

The magnitude of the applied voltage during polarization is essentially limited by the width $W_{iso,in}$ $W_{iso,out}$ of an insulation area between the edge of the internal electrode and the external electrode arranged on the surface of the transformer, and facing this edge but electrically insulated from this internal electrode. For the input part, this is the distance $W_{iso,in}$ between the first internal electrodes 12 and the second external electrode 15 or the distance $W_{iso,in}$ between the second internal electrodes 13 and the first external electrode 14. For the output part, this is the distance $W_{iso,out}$ between the first internal electrodes 22 and the second external electrode 25 or the distance $W_{iso,in}$ between the second internal electrodes 23 and the first external electrode 24.

During polarization a voltage is applied to the input or output part of the transformer. The electric field produced between the external electrode and the edge of the internal electrode can be stronger than the electric field between two opposing internal electrodes 12 and 13 or 22 and 23 of the opposite polarity, because the electric field between a conductive area and a sharp edge of an area arranged perpendicular to it is relatively greater than an electric field between two essentially parallel areas. This can lead to an electrical breakdown through the insulation area.

In order to be in the position to generate an electric field strong enough to ensure good characteristics for the piezoelectric ceramic and to prevent electrical breakdown, the width $W_{iso,in}$ of the insulation area must be greater than the distance $T_{in}$ between the internal electrodes 12 and 13 and/or the width $W_{iso,out}$ must be greater than the distance $T_{out}$ between the internal electrodes 22 and 23, i.e., $W_{iso,in} \geq T_{in}$ and/or $W_{iso,out} \geq T_{out}$. In an advantageous variant: $W_{iso,in} \geq n \times T_{in}$ for the input part 1 and $W_{iso,out} \geq n \times T_{out}$ for the output part 2 of the transformer, where the factor n is typically greater than or equal to two.

As an active area, a base body area is designated in which the internal electrodes of different polarity overlap. As an insulation area, a base body area is designated in which only the internal electrodes of one polarity are arranged. The width $W_{in}$ of the input part of the base body depends on the width $W_{iso,in}$ of the insulation area and the width $W_{act,in}$ of the active area as follows:

$$W_{in} = W_{act,in} + 2 \times W_{iso,in}.$$

The width $W_{out}$ of the output part of the base body depends on the width $W_{iso,out}$ of the insulation area and the width $W_{act,out}$ of the active area as follows:

$$W_{out} = W_{act,out} + 2 \times W_{is,out}.$$

Preferably, $W_{in} = W_{out} = w$, i.e., the width of the base body is constant.

Therefore, increasing the width of the insulation area to prevent breakdown leads to reduction of the active area relative to the total width of the transformer, if the total width W of the base body remains constant.

Here, it is disadvantageous that reduction of the active area typically decreases the electrical characteristics of the transformer, especially its efficiency.

Reducing the active area relative to the total width of the piezoelectric transformer due to an increased width of the insulation area can be avoided in the embodiments explained below.

The idea of a preferred embodiment includes dividing the input part 1 or the output part 2 of the transformer into several sections and coupling these parts to each other electrically, so that the voltage applied to each section is reduced relative to the total voltage applied to the input part by a factor that is essentially equal to the number of sections.

The electrical field strength in the insulation area of each section is proportional to the voltage applied to this section. Reducing the voltage applied to each section of the base body part reduces the likelihood of electrical breakdown through the insulation area, because in this way the field strength in the insulation area is reduced.

Reducing the voltage applied to each section leads to reduction of the electric field strength in the ceramic layers 11 or 21. In order to leave this field unchanged, in one variant the thickness of the layers is reduced in proportion to the number of sections. In this case, a given polarization of the ceramic can be achieved without electrical breakdown through the insulation area.

The number of sections in the input part 1 and/or the output part 2 of the transformer is selected to be large enough that the reduction of the width of the insulation area $W_{iso,in}$ in the input part 1 or $W_{iso,out}$ in the output part 2 of the transformer relative to the total width of the transformer is possible without increasing the risk of electrical breakdown through the insulation area. In this case, the width of the active area relative to the total width of the transformer is larger, which is advantageous for good output of the transformer.

Despite the change in thickness of the ceramic layers in the input part 1 and/or output part 2, after this has been divided into several sections, in a preferred embodiment the voltage transformation of the transformer is preserved. This is the case if the sections are interconnected to compensate for the change in thickness of the ceramic layers. The thickness of the ceramic layers can be reduced, e.g., proportional to the number of sections. For example, this thickness can be essentially halved for two sections interconnected electrically in series.

Figure 2:
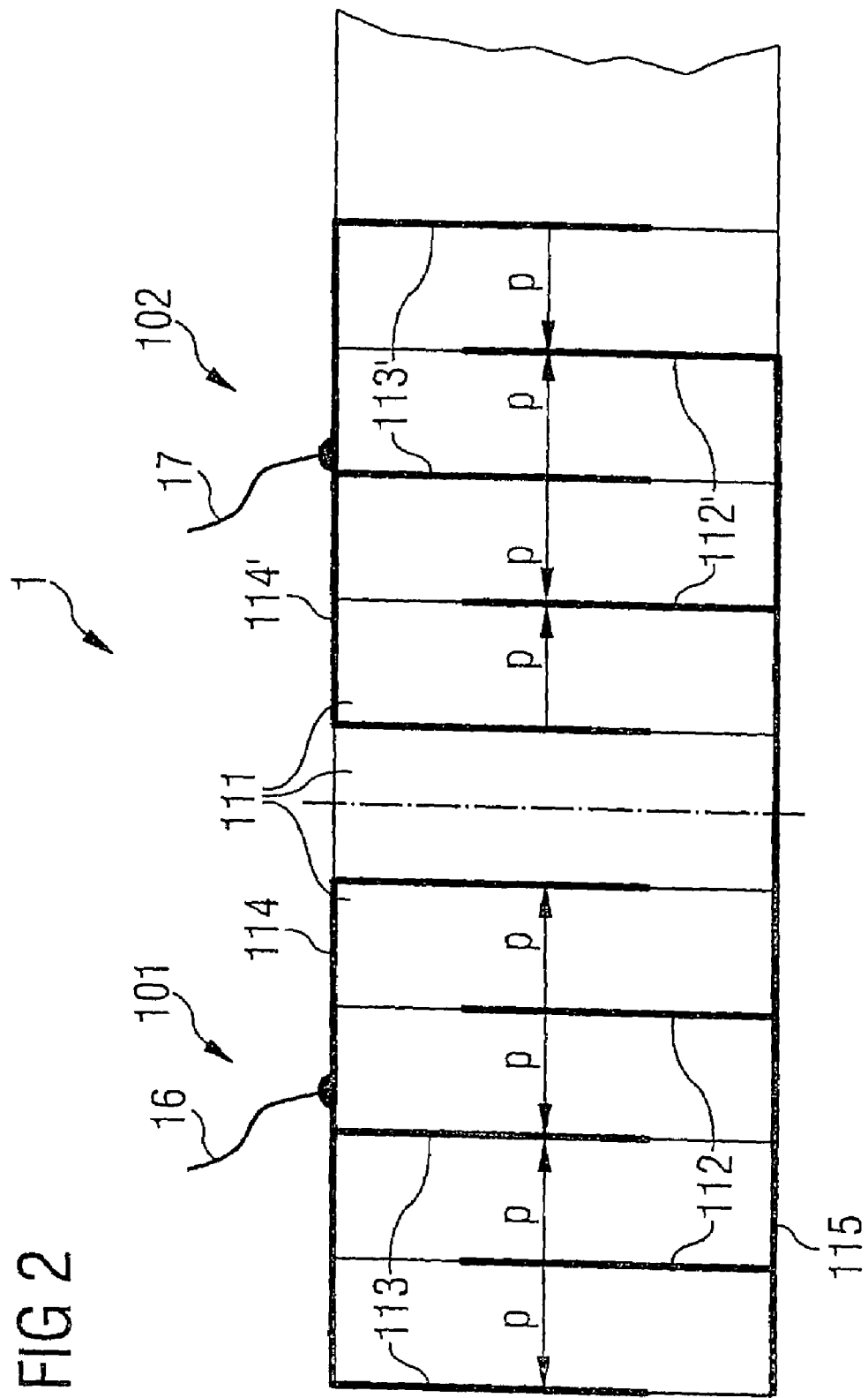
FIG. 2 is a cut-away view of an input part of the piezoelectric transformer divided into two sections, with the electrical connections of the input part being arranged on the same side surface of the base body.

FIG. 2 shows a base body part of the multilayer piezoelectric transformer, here the input part 1. The description of the input part in FIGS. 2 and 3 can also be applied to the output part of the transformer without loss of generality.

A common external electrode 115 is arranged on the surface of the base body of the piezoelectric transformer. The input part 1 is divided into two sections 101 and 102. These sections comprise ceramic layers 111, between which internal electrodes 112, 113, 112', 113' are arranged. The first internal electrodes 112, 112' of the sections 101 and 102 are connected electrically by means of the external electrode 115 so that the external electrode 115 is common to the two sections 101 and 102. The second internal electrodes 113 are interconnected by means of the first external electrode 114. The third internal electrodes 113' are interconnected by means of the second external electrode 114'. The piezoceramic layers are polarized in each section in the direction perpendicular to the internal electrodes 112, 113, 112', and 113'. In terms of the internal electrodes 112 and 112', the electrical polarization P in the ceramic layers in the section 102 is directed oppositely to the electrical polarization P in the ceramic layers in section 101. The connection wires 16 and 17 are connected to the external electrodes 114 and 114' for the purpose of electrical connection of the input part 1 of the piezoelectric transformer to an external electric circuit.

Figure 3:
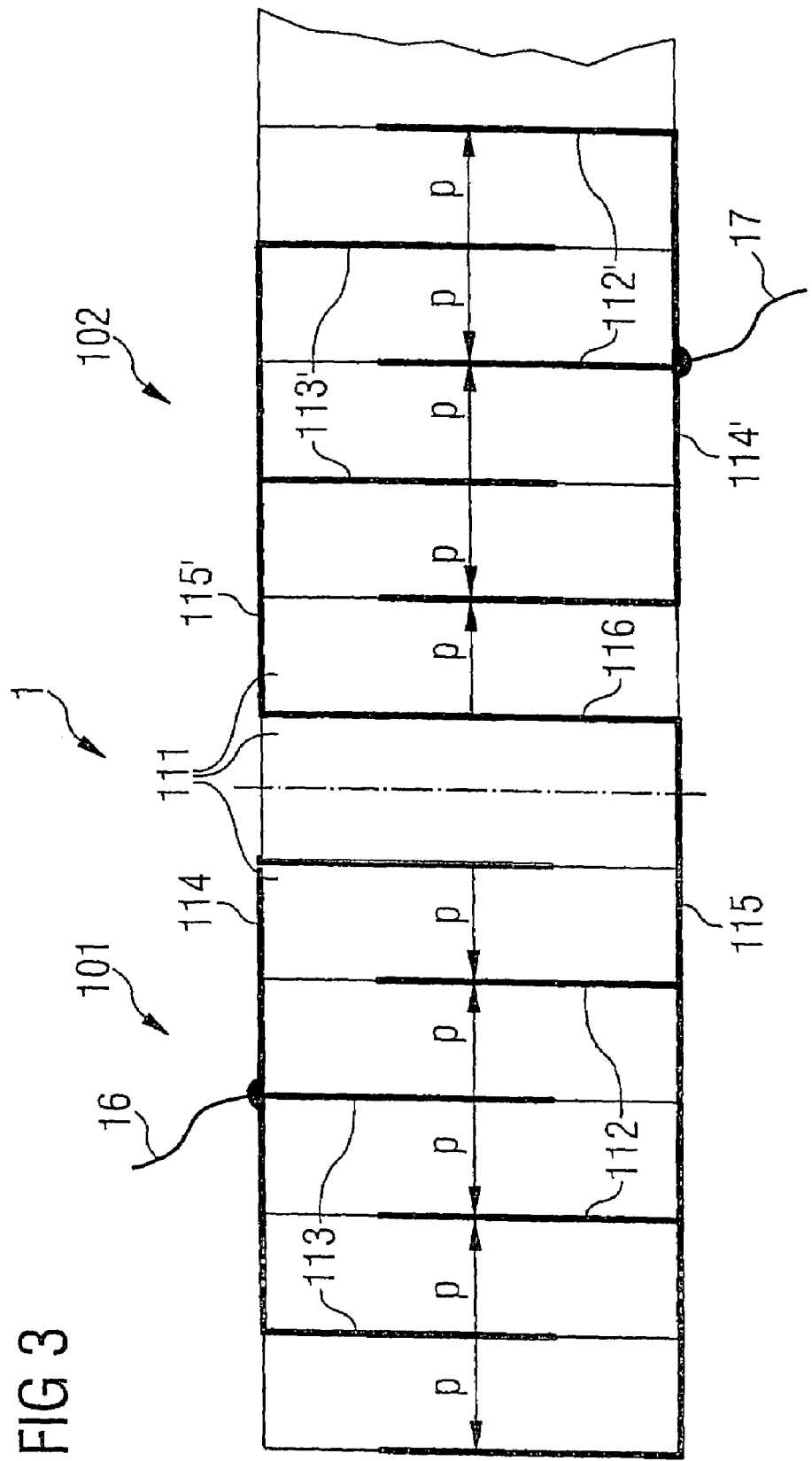
FIG. 3 is a cut-away view of an input part of the piezoelectric transformer divided into two sections, with two external electrodes arranged on different side surfaces of the base body and assigned to different sections being conductively connected via an internal electrode.

FIG. 3 shows in a cut-away view a part of the multilayer piezoelectric transformer, here the input part 1. The input part 1 is divided into two sections, 101 and 102. In contrast to the transformer from FIG. 2, the collector electrode, to which the first internal electrodes of the two sections 101 and 102 are connected, has three parts: a third external electrode 115 and a fourth external electrode 115' that are arranged on two different, here opposite, side surfaces of the transformer, and an internal electrode 116, which connects these conductively. This internal electrode 116 is shown in FIG. 3 as an internal electrode included in the base body of the piezoelectric transformer. As an alternative solution, the connection between the electrodes 115 and 115' can be realized by means of a wire running outside of the base body or by means of a connection running at least partially along the surface of the base body.

What is claimed is:

1. A piezoelectric transformer comprising:
a base body;
wherein the base body is separated into an input part and an output part, which each form a contiguous part of the base body;
at least three groups of internal electrodes within only one of the input part or the output part, each group comprising a plurality of electrodes, and
wherein the internal electrodes within each group are interconnected in an electrically conductive way and are electrically isolated from the internal electrodes of the other groups.

2. The piezo electric transformer according to claim 1,
wherein the base body is divided into at least two sections;
wherein the at least three groups of internal electrodes comprise a first group, a second group and a third group of internal electrodes;
wherein first internal electrodes arranged in a first section and an adjacent second section are conductively interconnected and form the first group; and
wherein the second group of second internal electrodes limited to the first section, and wherein the third group of third electrodes is limited to the second section.

3. The piezo electric transformer according to claim 2,
wherein the first and the second internal electrodes arranged in the first section have an alternating arrangement, one above the other, for forming a first capacitor;
wherein the first and the third internal electrodes arranged in the second section have an alternating arrangement, one above the other, for forming a second capacitor; and
wherein the first and the second capacitors are coupled in series.

4. The piezoelectric transformer according to claim 2, wherein the second internal electrodes are coupled to a first external electrode of the base body and the third internal electrodes are coupled to a second external electrode of the base body.

5. The piezoelectric transformer according to claim 2, wherein both the first internal electrodes arranged in the first section and also the first internal electrodes arranged in the second section are coupled to a third external electrode.

6. The piezoelectric transformer according to claim 5, wherein an outermost second internal electrode and an outermost third internal electrode are turned towards each other.

7. The piezoelectric transformer according to claim 2,
wherein the first internal electrodes arranged in the first section are coupled to a third external electrode and the first internal electrodes arranged in the second section are coupled to a fourth external electrode; and
wherein the third and the fourth external electrodes are arranged on different side surfaces of the base body and are conductively interconnected by means of an internal electrode.

8. The piezoelectric transformer according to claim 7, wherein the internal electrode, which connects the third and the fourth external electrode is arranged between a terminal second internal electrode and a terminal third internal electrode.

9. The piezoelectric transformer according to claim 2,
wherein the base body has piezoelectric layers, between which the internal electrodes are arranged; and
wherein the adjacent sections the polarization of the piezoelectric layers are oppositely directed relative to the first internal electrodes.

10. The piezoelectric transformer according to claim 1,
wherein the base body has piezoelectric layers, between which the internal electrodes are arranged; and
wherein, for at least one of the input part or the output part, the thickness of the piezo electric layers is less than a distance between the edges of the internal electrodes of one group and an external electrode arranged on the base body surface facing these internal electrodes but electrically isolated from these internal electrodes.

11. The piezoelectric transformer according to claim 10, wherein said distance equals a maximum of 0.5 mm.

12. A piezo electric transformer comprising:
a base body that includes an input part and an output part, the input part and the output part each forming a contiguous part of the base body, the base body including a first section and a second section, the first section and the second section both part of only one of the input part or the output part; and
a first group, a second group and a third group of internal electrodes, the first group comprising conductively interconnected internal electrodes arranged in the first section and the second section, the second group comprising conductively interconnected internal electrodes only in the first section, and the third group comprising conductively interconnected internal electrodes only in the second section, wherein the internal electrodes of the first group are electrically isolated from the internal electrodes of the second group, the internal electrodes of the first group are electrically isolated from the internal electrodes of the third group, and the internal electrodes of the second group are electrically isolated from the internal electrodes of the third group.

13. The piezo electric transformer according to claim 12, wherein the input part includes the first section and the second section.

14. The piezoelectric transformer according to claim 12,
wherein the internal electrodes of the first group that are arranged in the first section and the internal electrodes of the second group are arranged so as to form a first capacitor; and
wherein the internal electrodes of the first group that are arranged in the second section and the internal electrodes in the third group are arranged so as to form a second capacitor, the first capacitor and the second capacitor being coupled in series.

15. The piezoelectric transformer according to claim 12, further comprising:
a first external electrode coupled to the internal electrodes of the second group;
a second external electrode coupled to the internal electrodes of the third group; and
a third external electrode coupled to the internal electrodes of the first group.

16. The piezo electric transformer according to claim 15, wherein the first external electrode and the second external electrode are each spaced from the third external electrode by the base body.

17. The piezoelectric transformer according to claim 15, wherein the third external electrode includes a first portion and a second portion, the first portion being spaced from the second portion by the base body and being electrically coupled to the second portion by an internal electrode.

18. The piezoelectric transformer according to claim 17, wherein the internal electrode that couples the third and the fourth external electrode is arranged between an internal electrode of the second group and an internal electrode of the third group.

19. The piezoelectric transformer according to claim 1, further comprising at least three further groups of internal electrodes within only one of the input part or the output part, each further group comprising a plurality of electrodes, the further groups of electrodes with a different part of the base body than the three groups of electrodes, wherein the internal electrodes within each of the further groups are interconnected in an electrically conductive way and are electrically isolated from the internal electrodes of the other groups.

20. The piezoelectric transformer according to claim 12, wherein the base body further includes a third section and a fourth section, the third section and the fourth section both part of only the input part or the output part, wherein the third section and the fourth section are in a different part of the base body than the first section and the second section, the piezoelectric transformer further comprising:
a fourth group, a fifth group and a sixth group of internal electrodes, the fourth group comprising conductively interconnected internal electrodes arranged in the third section and the fourth section, the fifth group comprising conductively interconnected internal electrodes only in the third section, and the sixth group comprising conductively interconnected internal electrodes only in the fourth section, wherein the internal electrodes of the fourth group are electrically isolated from the internal electrodes of the fifth group, the internal electrodes of the fourth group are electrically isolated from the internal electrodes of the sixth group, and the internal electrodes of the fifth group are electrically isolated from the internal electrodes of the sixth group.

* * * * *

UNITED STATES PATENT AND TRADEMARK OFFICE
CERTIFICATE OF CORRECTION

| | | |
|---|---|---|
| PATENT NO. | : 7,411,340 B2 | Page 1 of 1 |
| APPLICATION NO. | : 11/705810 | |
| DATED | : August 12, 2008 | |
| INVENTOR(S) | : Florian et al. | |

It is certified that error appears in the above-identified patent and that said Letters Patent is hereby corrected as shown below:

In Col. 5, line 48, delete "piezo electric" and insert --piezoelectric--.
In Col. 5, line 59, delete "piezo electric" and insert --piezoelectric--.
In Col. 6, line 37, delete "piezo electric" and insert --piezoelectric--.
In Col. 6, line 44, delete "piezo electric" and insert --piezoelectric--.
In Col. 6, line 65, delete "piezo electric" and insert --piezoelectric--.
In Col. 7, line 19, delete "piezo electric" and insert --piezoelectric--.

Signed and Sealed this

Twenty-first Day of October, 2008

JON W. DUDAS
*Director of the United States Patent and Trademark Office*